(12) United States Patent
Gebara et al.

(10) Patent No.: US 7,994,845 B2
(45) Date of Patent: Aug. 9, 2011

(54) SWITCHED-CAPACITOR CHARGE PUMPS

(75) Inventors: Fadi H. Gebara, Austin, TX (US); Jente B. Kuang, Austin, TX (US); Abraham Mathews, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/778,960

(22) Filed: May 12, 2010

(65) Prior Publication Data

US 2010/0220541 A1     Sep. 2, 2010

Related U.S. Application Data

(62) Division of application No. 11/927,784, filed on Oct. 30, 2007, now Pat. No. 7,760,010.

(51) Int. Cl.
  *G05F 3/16*    (2006.01)
  *G05F 1/46*    (2006.01)
  *H02M 3/18*    (2006.01)

(52) U.S. Cl. .................. 327/536; 363/60; 365/226

(58) Field of Classification Search .................. None
See application file for complete search history.

(56) References Cited

U.S. PATENT DOCUMENTS

| | | | |
|---|---|---|---|
| 6,661,682 B2 * | 12/2003 | Kim et al. | 363/59 |
| 6,734,717 B2 | 5/2004 | Min | |
| 6,967,523 B2 * | 11/2005 | DeMone | 327/537 |
| 6,995,603 B2 * | 2/2006 | Chen et al. | 327/536 |
| 7,072,193 B2 | 7/2006 | Lin | |
| 7,282,986 B2 | 10/2007 | Kang et al. | |
| 7,382,176 B2 | 6/2008 | Ayres et al. | |
| 7,382,177 B2 * | 6/2008 | Cordoba et al. | 327/536 |
| 7,449,944 B2 * | 11/2008 | Byeon et al. | 327/589 |
| 7,466,188 B2 | 12/2008 | Fifield | |
| 7,466,257 B2 | 12/2008 | Akizuki et al. | |
| 2007/0096796 A1 | 5/2007 | Firmansyah et al. | |

OTHER PUBLICATIONS

J. Dickson, "On-Chip High-Voltage Generation in MNOS Integrated Circuits Using an Improved Voltage Multiplier Technique," IEEE Journal of Solid-State Circuits vol. SC-11, n. 3, pp. 374-378 (Jun. 1976).

Y. Nakagome, "An Experimental 1.5-V 64-Mb DRAM," IEEE Journal of Solid-State Circuits vol. 26, n. 4, pp. 465-472 (Apr. 1991).

H. Lee et al., "Switching Noise and Shoot-Through Current Reduction Techniques for Switched-Capacitor Voltage Doubler," IEEE Journal of Solid-State Circuits vol. 40, n. 5, pp. 1136-1146 (May 2005).

* cited by examiner

*Primary Examiner* — Lincoln Donovan
*Assistant Examiner* — Terry L Englund
(74) *Attorney, Agent, or Firm* — Libby Z. Toub; Jack V. Musgrove

(57) ABSTRACT

A switched-capacitor charge pump comprises a two-phase charging circuit, cross-coupled transistors connected to output nodes of the switched capacitors, and a pump output connected to source terminals of the cross-coupled transistors. The charge pump has side transistors for boosting charge transfer, and gating logic of the side transistors includes level shifters which control connections to the pump output or a reference voltage. Negative and positive charge pump embodiments are provided. The charging circuit utilizes non-overlapping wide and narrow clock signals to generate multiple gating signals. The pump clock circuit preferably provides independent, programmable adjustment of the widths of the wide and narrow clock signals. An override mode can be provided using clamping circuits which shunt the pump output to the second nodes of the switched capacitors.

10 Claims, 7 Drawing Sheets

SWITCHED-CAPACITOR CHARGE PUMPS

CROSS-REFERENCE TO RELATED APPLICATION

This application is a divisional of U.S. patent application Ser. No. 11/927,784 filed Oct. 30, 2007, now U.S. Pat. No. 7,760,010 issued Jul. 20, 2010.

BACKGROUND OF THE INVENTION

1. Field of the Invention

The present invention generally relates to voltage supplies for integrated circuits, and more particularly to switched-capacitor charge pumps used to power electronic memory structures such as dynamic random-access memory (DRAM).

2. Description of the Related Art

Power management has become a dominant concern in the development of data processing systems. Excess power usage is not only costly and inefficient, but also leads to heat management problems. These problems are particularly pronounced in computer systems having large amounts of memory. State of the art computer systems typically use dynamic random-access memory (DRAM) which is preferable over other memory structures such as static random-access memory (SRAM) because DRAM is more dense. However, DRAM can be more power intensive in circuit blocks for active power supply generation and refresh. SRAM uses a flip-flop memory cell but DRAM uses a capacitor-based memory cell which, due to current leakage, must be regularly refreshed. DRAM can consume a significant portion of a system's overall power.

Power management has become even more challenging with the advent of new memory technologies like embedded DRAM (eDRAM). This new design relies on the silicon-on-insulator (SOI) technology pioneered by International Business Machines Corp. using deep-trench capacitors. Deep-trench (3-dimensional) capacitors have a reduced footprint on the semiconductor substrate, and an eDRAM array has about one-third the area of a comparable DRAM array. Reducing the size of the memory makes it easier to embed the array on the same integrated circuit chip, e.g., a microprocessor or an application-specific integrated circuit (ASIC), to provide a system-on-a-chip solution. An exemplary commercial microprocessor might devote up to 60% of its surface area to memory. Replacing conventional DRAM with eDRAM cells allows the chip designer to build smaller chips and reduce the length of wire that data must travel as it commutes around the chip, resulting in the fastest memory access times ever recorded. Embedding memory further permits much wider buses and higher operation speeds and, due to the much higher density of eDRAM, larger amounts of memory can potentially be used.

An eDRAM array requires an on-chip power supply having precise high and low voltages (positive and negative) for the word lines that drive the rows of the memory array. The high voltage is used to activate a word line, and the low voltage is for standby. Various power supply designs can be used to deliver these voltages, including for example the Cockcroft-Walton voltage multiplier, the Dickson charge pump, and the Nakagome voltage doubler. The Cockcroft-Walton voltage multiplier uses a ladder network of capacitors and diodes or switches connected to a low voltage input. As a charge cascades through the capacitors it successively increases to finally yield a higher voltage at the output. The Dickson charge pump operates in a similar manner but in the Dickson design the nodes of the diode chain are coupled to the inputs via capacitors in parallel instead of in series. The Nakagome voltage doubler uses switched capacitors whose output nodes are connected to cross-coupled transistors An advanced power supply based on the Nakagome design is described in the article "Switching Noise and Shoot-Through Current Reduction Techniques for Switched-Capacitor Voltage Doubler" by H. Lee and P. Mok, Journal of Solid-State Circuits vol. 40, n. 5, pp. 1136-1146 (May 2005), shown in FIG. 1. The voltage doubler 10 is driven by two-phase, non-overlapping clock signals produced by a clock phase generator 12 and two sets of inverter chains 14a, 14b. The clock signals control a first transistor pair 16a, 16b which charge and discharge the first capacitor 18, and a second transistor pair 20a, 20b which charge and discharge the second capacitor 22. The input terminals of transistors 16a and 20a are connected to the power supply voltage $V_{dd}$. A voltage booster circuit includes a pair of cross-coupled transistors 24a, 24b connected to the output nodes of capacitors 18 and 22 which provides automatic reverse bias of the junctions. The other terminals of transistors 24a and 24b are connected to the power supply voltage $V_{dd}$. Two serial transistors 26a, 26b in the booster circuit act as charge-transfer devices. The inputs and gates of transistors 26a, 26b are driven by respective level shifters 28a, 28b. Two additional transistors 30a, 30b are provided which increase the amount of transient current and thereby allow the serial power transistors 26a, 26b to be turned off faster. Two additional capacitors 32, 34 are connected in parallel with a resistor 36 between electrical ground and the input of transistor 30b for noise suppression. The common rail of transistor 26b, transistor 30b, capacitors 32, 34 and resistor 36 is the output $V_{pp}$ of the voltage doubler.

While conventional charge pump designs such as that depicted in FIG. 1 achieve some efficiency by reducing no-load supply current dissipation, they still suffer from other inefficiencies relating to capacitive loading, voltage ripples, and peak current density. These inefficiencies can significantly affect power management in demanding applications such as eDRAM. It would, therefore, be desirable to devise an improved charge pump which could provide more efficient energy conversion with tight active and standby power control. It would be further advantageous if the improved charge pump could be provided in a more compact design.

SUMMARY OF THE INVENTION

It is therefore one object of the present invention to provide an improved charge pump for a regulated voltage supply.

It is another object of the present invention to provide such a charge pump that has both positive level and negative level solutions for application in driving word lines of an addressable memory array.

It is yet another object of the present invention to provide a switched-capacitor charge pump having an enhanced two-phase topology which achieves more efficient clock edge handling and reduced clock loading.

The foregoing objects are achieved in a charge pump generally comprising first and second switched capacitors, a charging circuit which charges a first node of the first switched capacitor while discharging a first node of the second switched capacitor during a first clock phase and charges the first node of the second switched capacitor while discharging the first node of the first switched capacitor during a second clock phase, first and second cross-coupled transistors connected to second nodes of the switched capacitors, and a pump output connected to source terminals of the cross-coupled transistors. The charge pump may further have first and second side transistors wherein a first terminal of the first side transistor is connected to the second node of the first switched capacitor, a second terminal of the first side transistor is connected to a first reference voltage, a first terminal of the second side transistor is connected to the second node of the second switched capacitor, and a second terminal of the second side transistor is connected to the first reference voltage. A first gate control circuit connects the gate of the first side transistor to the pump output during the first clock phase and to a second reference voltage during the second clock phase, and a second gate control circuit connects the gate of the second side transistor to the second reference voltage during the first clock phase and to the pump output during the second clock phase. In the preferred implementation the first gate control circuit includes a first level shifter whose output controls the connection of the gate of the first side transistor to the pump output and the second reference voltage, and the second gate control circuit includes a second level shifter whose output controls the connection of the gate of the second side transistor to the second reference voltage and the pump output. Negative and positive charge pump embodiments are provided.

The charging circuit advantageously utilizes non-overlapping wide and narrow clock signals to generate multiple gating signals. The charge pump may include a pump clock circuit which provides independent, programmable adjustment of the widths of the wide and narrow clock signals. An override mode can be provided using clamping circuits which shunt the pump output to the second nodes of the switched capacitors.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
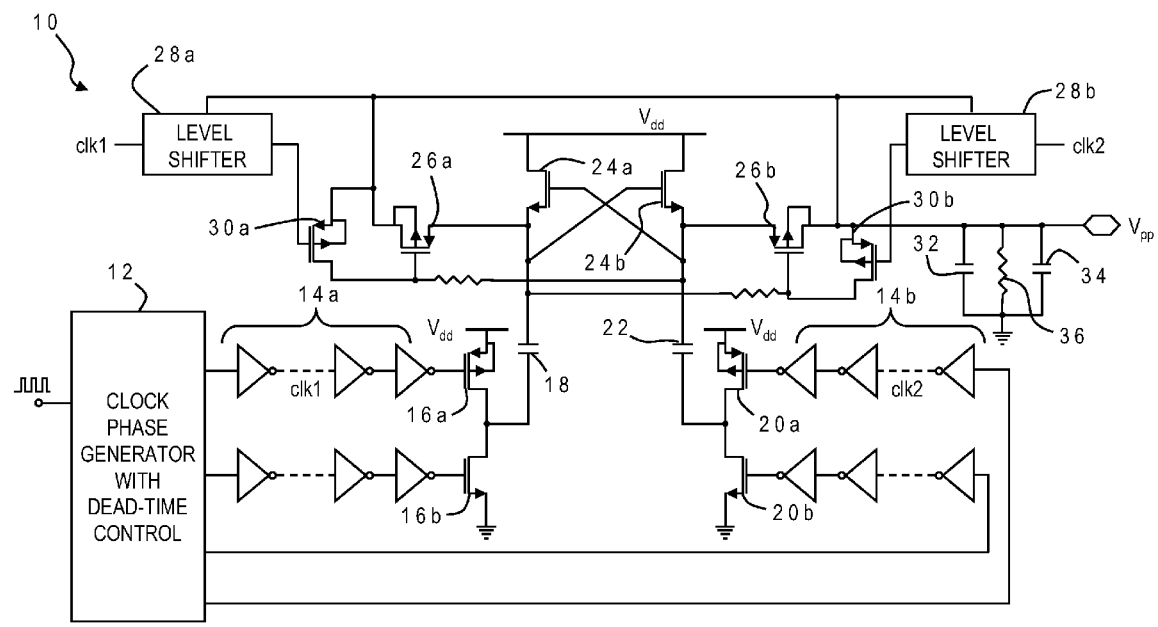
FIG. 1 is a schematic diagram of a conventional Nakagome-type charge pump with a voltage booster circuit.
Figure 2:
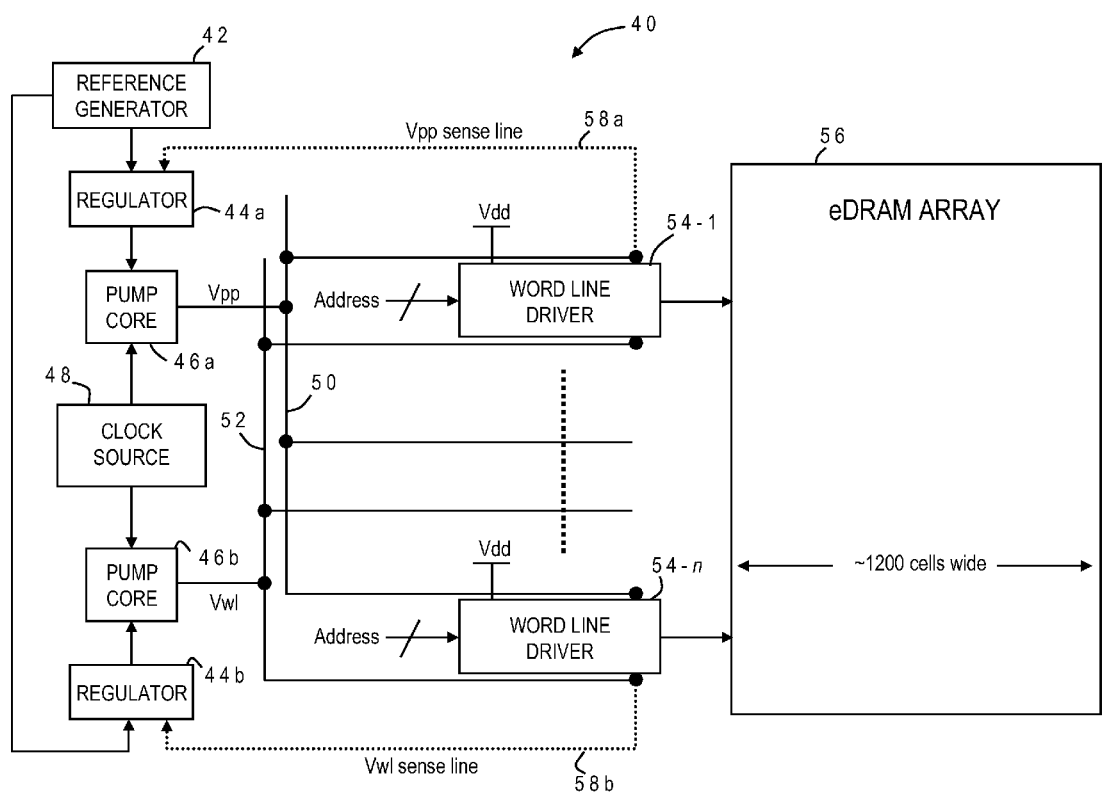
FIG. 2 is a high level block diagram of one embodiment of a power supply circuit for an embedded dynamic random-access memory array constructed in accordance with the present invention.

With reference now to the figures, and in particular with reference to FIG. 2, there is depicted one embodiment 40 of a power supply circuit constructed in accordance with the present invention for use with an embedded dynamic random-access memory (eDRAM) array. Power supply circuit 40 is generally comprised of a reference generator 42, two regulators 44a, 44b, two pump cores 46a, 46b, and a clock source 48. Clock source 48 provides a single clock signal to each of the pump cores 46a, 46b. The frequency of the clock signal may vary considerably depending upon performance requirements, but is preferably in the range of 50-300 MHz, and around 100 MHz in the exemplary embodiment. Clock source can be for example phase-lock loop driven by an oscillator. Pump cores 46a, 46b are cross-coupled, switched-capacitor charge pump circuits described more fully below in conjunction with FIGS. 3 and 6. Pump core 46a provides a high voltage level $V_{pp}$ to an active voltage rail 50, while pump core 46b provides a low voltage level $V_{w1}$ to a standby voltage rail 52. The high voltage level $V_{pp}$ may be referred to a positive voltage and the low voltage level $V_{w1}$ may be referred to as a negative voltage, but these terms are relative and those skilled in the art will appreciate that both the high and low voltage levels may for example be positive voltage values. In the illustrative embodiment $V_{pp}$ is in the range of 1.4 to 1.8 volts and $V_{w1}$ is in the range of −0.3 to −0.7 volts.

Rails 50, 52 have pairs of taps connected to respective word line drivers 54-1, 54-n. Each word line driver 54 is used to activate a corresponding row of memory cells in eDRAM array 56. In this example eDRAM array 56 is 1200 cells wide, i.e., each word line is connected to 1200 cells in that row. A memory address for a requested memory block is decoded by memory control logic (not shown) and the resulting signal is used to activate the appropriate word line driver which then switches the voltage for that word line to $V_{pp}$ while the other word lines are maintained at $V_{w1}$. The switching circuitry within a word line driver 54 uses a separate supply voltage $V_{dd}$ (e.g., around 1.0 volt). Sense lines 58a, 58b connected to the inputs of word line drivers 54 are used to provide feedback to regulators 44a, 44b. Regulators 44a, 44b determine an upper limit of the pump voltages and temporarily disable a pump core if the output voltage exceeds the limit. Reference generator 42 generates an internal stable voltage that is used by regulators 44a, 44b for comparison purposes. Reference generator may be a band gap circuit or voltage divider, or an external reference can be provided.

Figure 3:
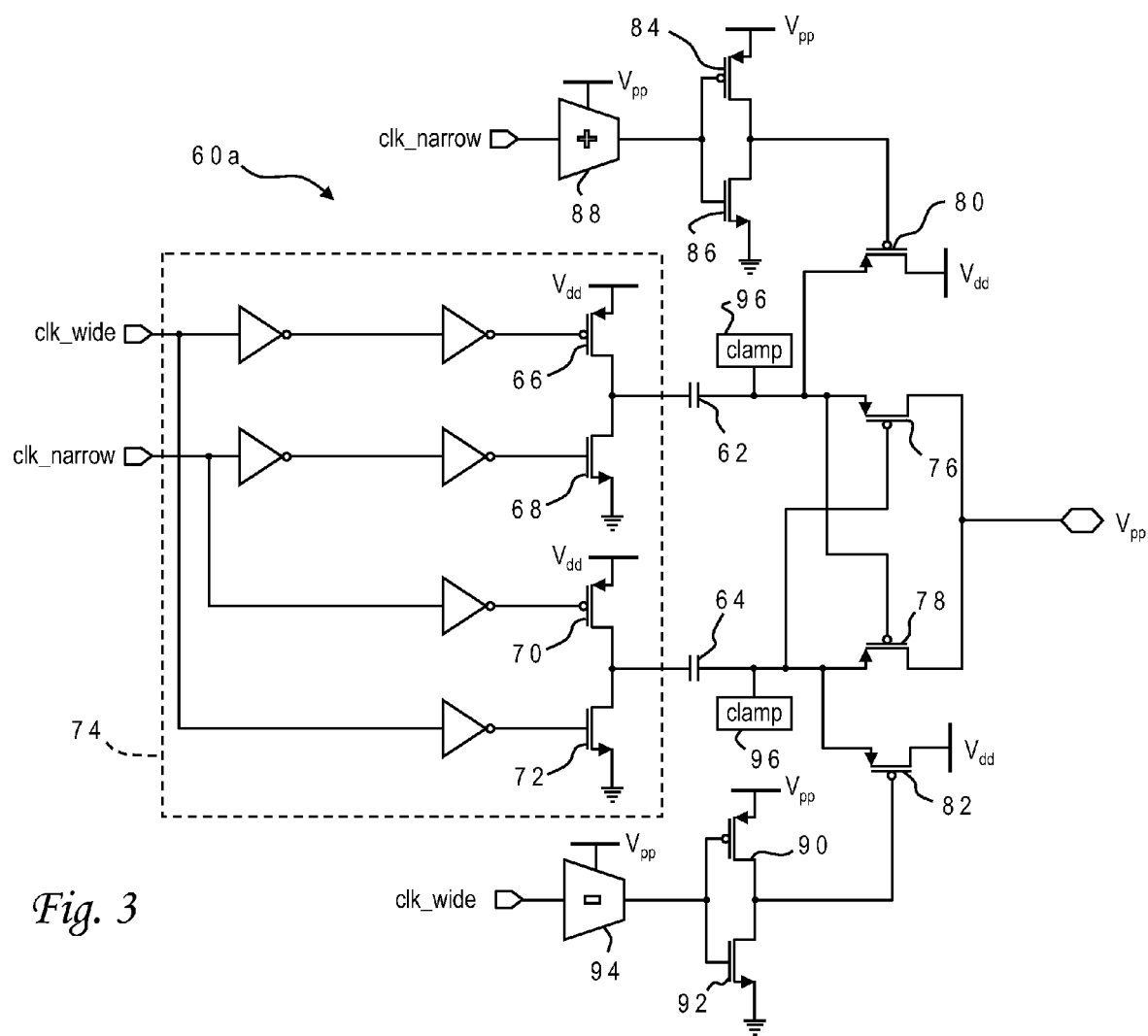
FIG. 3 is a schematic diagram of one embodiment of a positive charge pump constructed in accordance with the present invention.

Referring now to FIG. 3, one example of a positive pump engine 60a for pump core 46a is illustrated in further detail. Positive pump engine 60a includes two switched capacitors 62, 64. Capacitors 62, 64 are preferably deep-trench capacitors. Their capacitance may vary depending upon the desired pump capacity, i.e., the ability to maintain the desired voltage across the output rail for a sustained load. In the illustrative embodiment the capacitance is around 50-1000 picofarad.

The input node of capacitor 62 is coupled to a power supply voltage $V_{dd}$ by a p-type metal oxide semiconducting (PMOS) transistor 66 and to electrical ground by an n-type metal oxide semiconducting (NMOS) transistor 68. PMOS transistor 66 is controlled by a first gating signal derived from a first clock signal "clk_wide" and NMOS transistor 68 is controlled by a second gating signal derived from a second clock signal "clk_narrow". The duty cycle of the "clk_wide" signal is greater than 50% while the duty cycle of the "clk_narrow" is less than 50%. The two signals are non-overlapping for break-before-make switching to avoid leakage. Each of these clock signals pass through a series of buffers (inverters) which provide a desired time delay.

The input node of capacitor 64 is similarly coupled to the power supply voltage $V_{dd}$ by another PMOS transistor 70 and to electrical ground by another NMOS transistor 72. PMOS transistor 70 is controlled by a third gating signal derived from the "clk_narrow" signal and NMOS transistor 72 is controlled by a fourth gating signal derived from the "clk_wide" signal. The clock signals again pass through one or more buffers or inverters which provide a desired time delay such that the input node of capacitor 62 is charging (connected to $V_{dd}$) when the input node of capacitor 64 is discharging (connected to ground) during the first clock phase, and the input node of capacitor 64 is charging when the input node of capacitor 62 is discharging during the second clock phase.

The pumping devices 66, 68, 70, 72 are preferably of non-body contact type to conserve area. The region 74 containing the inverters and pumping devices (the charging circuit) is preferably thin-oxide in order to support lower voltages. This two-phase inverter topology combined with the use of wide and narrow clock signals provides superior clock edge control while reducing clock loading, and is relatively compact.

Two cross-coupled PMOS transistors 76, 78 are respectively connected to the output nodes of capacitors 62, 64. The source terminals of transistors 76, 78 are interconnected to provide the output voltage $V_{pp}$ of the charge pump. Each output node is also coupled to a reference voltage by respective PMOS transistors 80, 82; for the positive pump embodiment this reference voltage is the power supply voltage $V_{dd}$. The gate of PMOS transistor 80 is coupled to the pump output voltage $V_{pp}$ by a PMOS transistor 84 and to electrical ground by an NMOS transistor 86. The gates of PMOS transistor 84 and NMOS transistor 86 are in turn controlled by the output of a level shifter 88. The high voltage rail of level shifter 88 is connected to the pump output voltage $V_{pp}$. Level shifter 88 has a positive polarity and its input is the "clk_narrow" signal. The gate of PMOS transistor 82 is similarly coupled to the pump output voltage $V_{pp}$ by another PMOS transistor 90 and to electrical ground by another NMOS transistor 92. The gates of PMOS transistor 90 and NMOS transistor 92 are in turn controlled by the output of another level shifter 94. The high voltage rail of level shifter 94 is connected to the pump output voltage $V_{pp}$. Level shifter 94 has a negative polarity (its output is the logical complement of the input) and its input is the "clk_wide" signal. This topology for the side charging devices 80, 82 provides a particularly well-regulated voltage level output.

Figure 7:
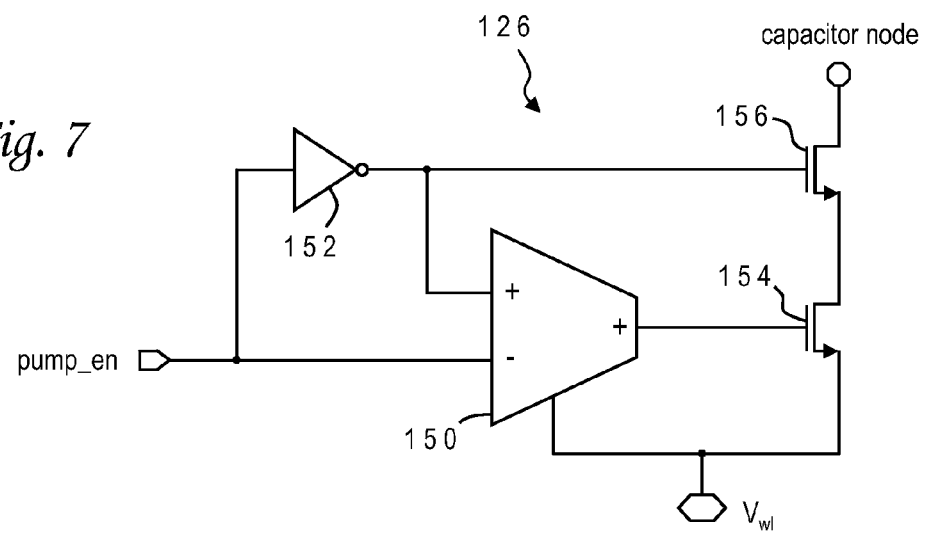
FIG. 7 is a schematic diagram of one embodiment of a negative pump clamp circuit constructed in accordance with the present invention.

The output nodes of each capacitor 62, 64 are also connected to clamp circuits 96 which are used in an override mode as explained further below in conjunction with FIGS. 7 and 8.

Figure 4:
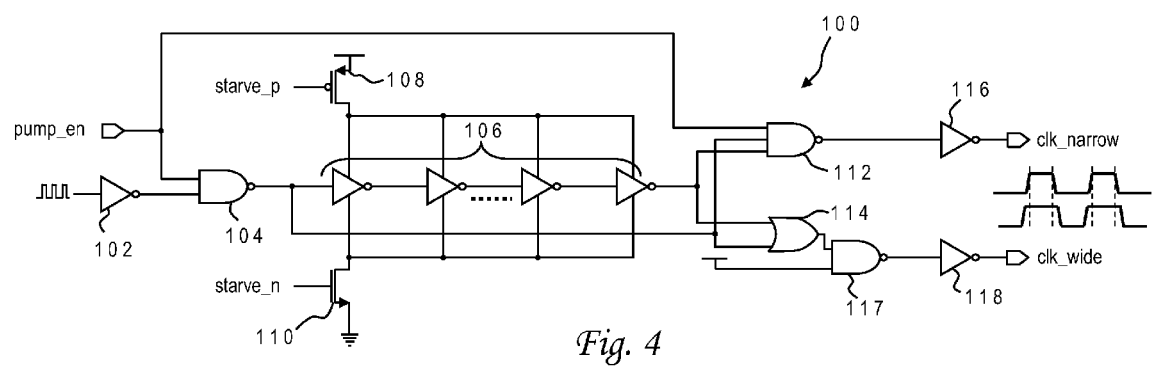
FIG. 4 is a schematic diagram of one embodiment of a pump clock circuit constructed in accordance with the present invention.

With further reference to FIG. 4, there is depicted one embodiment of a pump clock circuit 100 used to generate the "clk_wide" and "clk_narrow" signals. An inverter 102 receives the signal from clock source 48 and feeds the inverted signal to one input of a NAND gate 104. The other input of NAND gate 104 is connected to a pump enable signal ("pump_en") which is used for the override (clamp) mode. During normal operation of the charge pump the pump enable signal is turned on, so the output of NAND gate 104 is the same logical value as the input to inverter 102. This value is then fed to an inverter chain 106; although only four inverters are shown in the chain, there could be more or less. The high voltage inputs for these inverters are coupled to the power supply voltage $V_{dd}$ by a PMOS transistor 108 and their low voltage inputs are coupled to electrical ground by an NMOS transistor 110. PMOS transistor 108 and NMOS transistor 110 are respectively controlled by a "starve_p" signal and a "starve_n" signal. The output of the final inverter in chain 106 is fed to one input of another NAND gate 112 and to one input of an OR gate 114. NAND gate 112 also has inputs connected to the output of NAND gate 104 and to the pump enable signal. The output of NAND gate 112 is connected to an inverter 116 whose output is the narrow clock signal. The other input of OR gate 114 is connected to the output of NAND gate 104, and the output of OR gate 114 is connected to one input of a NAND gate 117. The other input of NAND gate 117 is connected to the power supply voltage $V_{dd}$. The output of NAND gate 117 is connected to an inverter 118 whose output is the wide clock signal.

The starve signals limit the operation of the chain inverters and are used to the adjust the separation of the two output pulses "clk_narrow" and "clk_wide". Each starve signal provides analog gate control varying from ground to $V_{dd}$ depending on how much delay is desired. The two starve signals can be independently adjusted by external control logic that can be hardware- or software-controlled. The result is two non-overlapping, adjustable-width clock signals.

Figure 5:
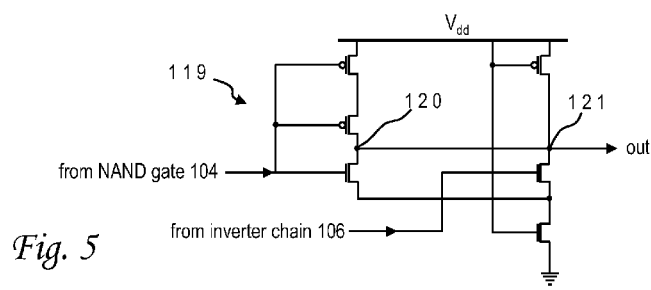
FIG. 5 is a transistor-level diagram of combinational logic for implementing part of the pump clock circuit of FIG. 4.

Gates 114 and 117 are preferably implemented in the combinational logic circuit 119 shown in FIG. 5. The output of circuit 119 is connected to two internal nodes 120, 121. The signal from NAND gate 104 controls a series of transistors to connect internal node 120 to either $V_{dd}$ or ground. The signal from the inverter chain 106 controls another transistor to connect internal node 121 to ground. This structure achieves the same delay as NAND gate 112 to keep the wide and narrow clock signals synchronized.

If the pump enable signal is turned off the clock is effectively disabled, setting the wide clock signal equal to $V_{dd}$ and setting the narrow clock signal to ground.

Figure 6:
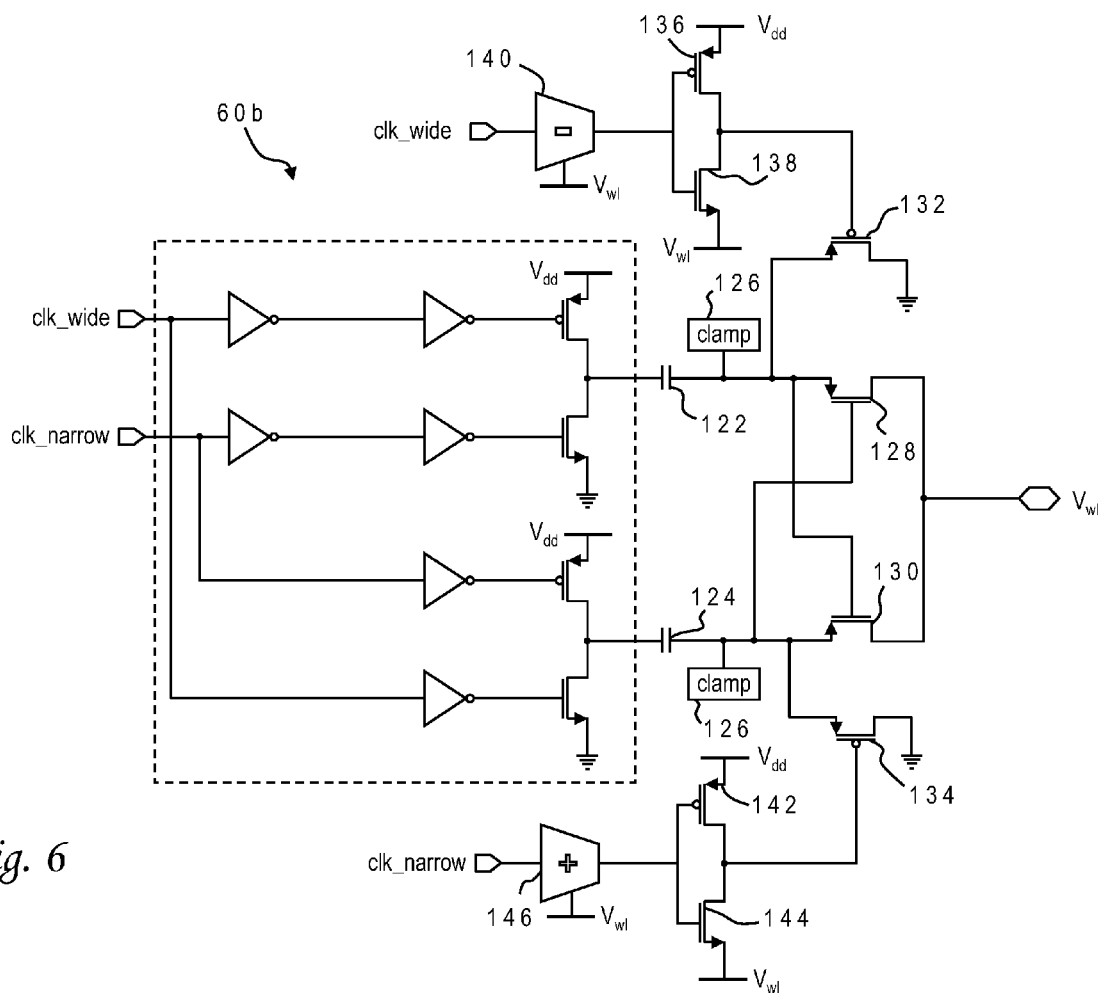
FIG. 6 is a schematic diagram of one embodiment of a negative charge pump constructed in accordance with the present invention.

An alternative embodiment of a negative pump engine 60b for pump core 46b is shown in FIG. 6. Negative pump engine 60b includes many of the same components found in positive pump engine 60a including two pairs of PMOS and NMOS transistors, controlled by four gating signals derived from the wide and narrow clock signals, that charge and discharge the deep-trench capacitors 122, 124, and clamps 126 connected to the output nodes of capacitors 122, 124 for effectuating the override mode. However, the cross-coupled transistors connected to the output nodes of the capacitors are NMOS transistors 128, 130 whose source terminals are interconnected to provide the output voltage $V_{w1}$ of the charge pump. Each output node is also coupled to a reference voltage by respective PMOS transistors 132, 134; for the negative pump embodiment this reference voltage is electrical ground. The gate of PMOS transistor 132 is coupled to the power supply voltage $V_{dd}$ by a PMOS transistor 136 and to the pump output voltage $V_{w1}$ by an NMOS transistor 138. The gates of PMOS transistor 136 and NMOS transistor 138 are in turn controlled by the output of a level shifter 140. The low voltage rail of level shifter 140 is connected to the pump output voltage $V_{w1}$. Level shifter 140 has a negative polarity and its input is the "clk_wide" signal. The gate of PMOS transistor 134 is similarly coupled to the power supply voltage $V_{dd}$ by another PMOS transistor 142 and to the pump output voltage $V_{w1}$ by another NMOS transistor 144. The gates of PMOS transistor 142 and NMOS transistor 144 are in turn controlled by the output of another level shifter 146. The low voltage rail of level shifter 146 is connected to the pump output voltage $V_{w1}$. Level shifter 146 has a positive polarity and its input is the "clk_narrow" signal.

During the first few clock cycles after start-up of either positive pump engine 60a or negative pump engine 60b, the output voltage ($V_{pp}$ or $V_{w1}$) will gradually move to the desired regulated level as the switched capacitors successively pump the output. The pumps achieve a steady-state output (with a voltage variation no greater than about 50 mV) after around 5 to 100 cycles depending upon the regulated level and load conditions. Those skilled in the art will appreciate that the invention encompasses other variations of the depicted positive and negative pump engines such as changing the side charging devices (80, 82, 132, 134) from PMOS to NMOS and switching the polarities of the level shifters that control them. PMOS devices are preferred for lower unregulated levels, while NMOS devices provide strong gate overdrive.

It may be useful to disable the charge pumps for a variety of reasons. As mentioned above, regulators 44a, 44b can temporarily disable the pumps if the output voltage ($V_{pp}$ or $V_{w1}$) exceeds the desired level. The pumps can also be disabled for an override mode wherein voltage is supplied from an external source along a by-pass path. Disabling the pump may further be helpful for other modes such as debugging or burn-in (blowing fuses in the memory array), or to provide an additional access mechanism for setting initial pump conditions if needed. Clamping circuits 96, 126 are provided for these situations. Clamping circuit 126 is used with the negative pump engine and is shown in detail in FIG. 7. The pump enable signal "pump_en" is connected to the negative input of a level shifter 150 and to an inverter 152, and is used to select the override mode. The pump enable signal may be generated by control logic for the eDRAM subsystem. The output of inverter 152 is connected to the positive input of level shifter 150. The low voltage rail of level shifter 150 is connected to the pump output $V_{w1}$. The output of level shifter 150 is connected to the gate of an NMOS transistor 154, and the output of inverter 152 is also connected to the gate of another NMOS transistor 156. The source terminal of NMOS transistor 154 is connected to the pump output $V_{w1}$ and its drain terminal is connected to the source terminal of NMOS transistor 156. The drain terminal of NMOS transistor 156 is connected to the output node of capacitor 122 or 124. The clamping circuit accordingly shunts the charge pump output to the switching capacitor node, and DC currents are thereby suppressed.

Figure 8:
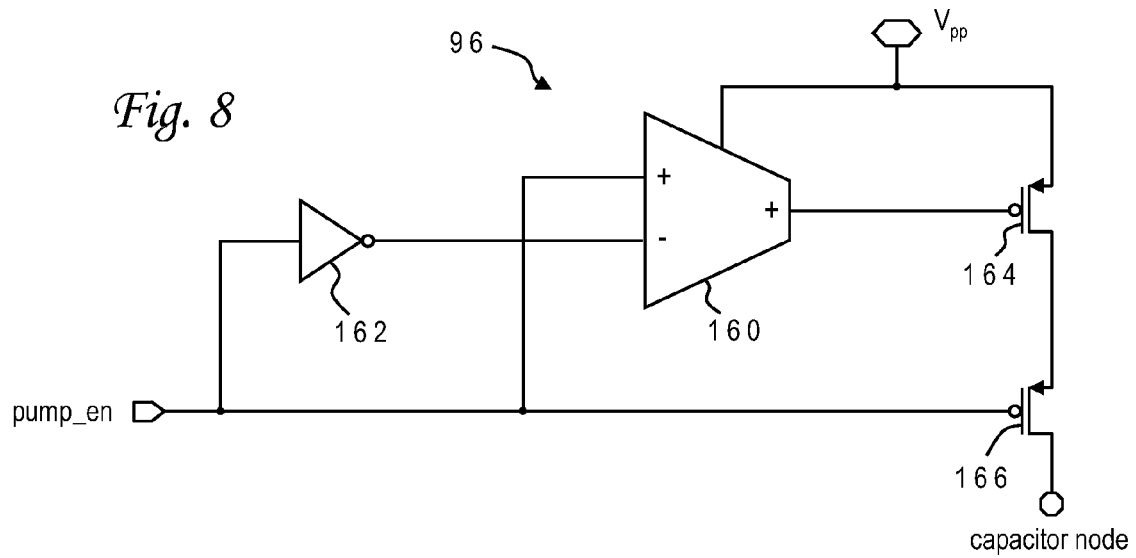
FIG. 8 is a schematic diagram of one embodiment of a positive pump clamp circuit constructed in accordance with the present invention.

Clamping circuit 96 is used with the positive pump engine and is shown in detail in FIG. 8. The pump enable signal "pump_en" is connected to the positive input of a level shifter 160 and to an inverter 162. The output of inverter 162 is connected to the negative input of level shifter 160. The high voltage rail of level shifter 160 is connected to the pump output $V_{pp}$. The output of level shifter 160 is connected to the gate of a PMOS transistor 164, and the pump enable signal is also connected to the gate of another PMOS transistor 166. The drain terminal of PMOS transistor 164 is connected to the pump output $V_{pp}$ and its source terminal is connected to the drain terminal of PMOS transistor 166. The source terminal of PMOS transistor 166 is connected to the discharge node, i.e., the output node of capacitor 62 or 64.

Figure 9:
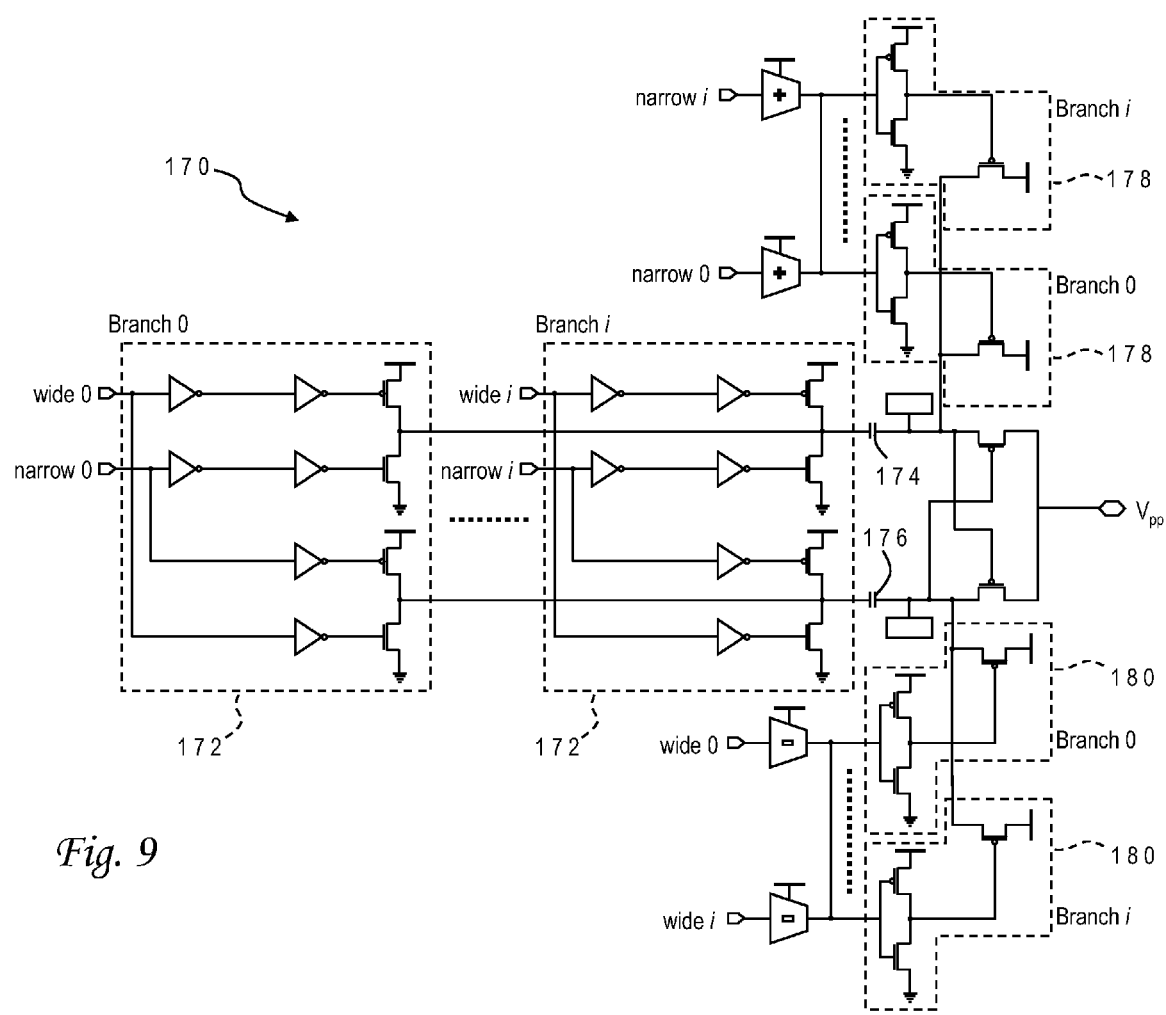
FIG. 9 is a schematic diagram of one embodiment of an adjustable charge pump constructed in accordance with the present invention.

The present invention may further advantageously be used to craft an adjustable strength pump, one embodiment of which is illustrated in FIG. 9. The adjustable charge pump 170 has a number i of front-end branches 172 which provide charging and discharging of switched capacitors 174, 176 in different clock phases. Each branch has its own wide and narrow clock signal inputs. One branch is gated to charge or discharge a given capacitor while other branches are not being gated. These front-end branches 172 make up the base pump engine capacity, which can be further boosted using side branches 178, 180. Side branches 178 provide charge transfer to capacitor 174 and side branches 180 provide charge transfer to capacitor 176. Side branches 178 are controlled by positive level shifters responsive to separate narrow clock signals, and side branches 180 are controlled by negative level shifters responsive to separate wide clock signals. The number of branches used is governed by the eDRAM control logic which turns off the branch clock signaling for any unused branches.

This embodiment has the same number i of front-end branches and side branches, but the front-end and side branches can be designed independently. This construction gives the circuit designer the ability to have both programmable front-end pump device strength and programmable side charging device strength for improved current and voltage level control. This control is particularly beneficial to mitigate variation and uncertainty in load, to limit over- or under-shooting transient power when the load is smaller than expected, and to reduce rippling after reaching steady state.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been described in the context of an eDRAM power supply, it has a wide variety of other applications. It is therefore contemplated that such modifications can be made without departing from the spirit or scope of the present invention as defined in the appended claims.

What is claimed is:

1. An adjustable capacity charge pump comprising:
   first and second switched capacitors each having a first node and a second node;
   a pump output coupled to said second nodes of said first and second switched capacitors; and
   a plurality of charging circuits, wherein each of said charging circuits selectively charges said first node of said first switched capacitor while discharging said first node of said second switched capacitor, each of said charging circuits operating in different clock phases, and each of said charging circuits being responsive to separate clock signals.

2. The adjustable capacity charge pump of claim 1 wherein at least one of said charging circuits is disabled by turning off the corresponding clock signals.

3. The adjustable capacity charge pump of claim 1 wherein each set of clock signals includes non-overlapping wide and narrow clock signals, the wide clock signal having a duty cycle greater than 50% and the narrow clock signal having a duty cycle less than 50%.

4. The adjustable capacity charge pump of claim 1 further comprising:
   a plurality of first side transistors which transfer charge to said second node of said first switched capacitor, a given one of said first side transistors associated with a first respective one of the charging circuits being responsive to a first one of said separate clock signals for the first respective charging circuit; and
   a plurality of second side transistors which transfer charge to said second node of said second switched capacitor, a given one of said second side transistors associated with a second respective one of the charging circuits being responsive to a second one of said separate clock signals for the second respective charging circuit.

5. The adjustable capacity charge pump of claim 4 wherein the number of first side transistors, the number of second side transistors, and the number of charging circuits are equal.

6. A power supply for a memory array comprising:
a clock source;
a positive charge pump having a first pair of switched capacitors, a first charging circuit which derives first multiple gating signals from the clock source to charge and discharge first nodes of said first pair of switched capacitors in different clock phases, a pair of cross-coupled p-type transistors connected by first terminals to second nodes of said first pair of switched capacitors, and a positive pump output connected to second terminals of said pair of cross-coupled p-type transistors;
an active voltage rail connected to said positive pump output;
a negative charge pump having a second pair of switched capacitors, a second charging circuit which derives second multiple gating signals from the clock source to charge and discharge first nodes of said second pair of switched capacitors in different clock phases, a pair of cross-coupled n-type transistors connected by first terminals to second nodes of said second pair of switched capacitors, and a negative pump output connected to second terminals of said pair of cross-coupled n-type transistors;
a standby voltage rail connected to said negative pump output; and
a plurality of word line drivers which switch word lines of the memory array to the active voltage rail or the standby voltage rail in response to a decoded memory address.

7. The power supply of claim 6 further comprising:
a first set of clamp circuits which selectively shunt said positive pump output to said second nodes of said first pair of switched capacitors; and
a second set of clamp circuits which selectively shunt said negative pump output to said second nodes of said second pair of switched capacitors.

8. The power supply of claim 6 wherein:
said first charging circuit includes a first pump clock circuit which generates a first wide clock signal and a first narrow clock signal that are used to derive the first multiple gating signals; and
said second charging circuit includes a second pump clock circuit which generates a second wide clock signal and a second narrow clock signal that are used to derive the second multiple gating signals.

9. The power supply of claim 8 wherein the widths of the first wide clock signal, the first narrow clock signal, the second wide clock signal, and the second narrow clock signal are independently adjustable.

10. The power supply of claim 8 wherein:
said positive charge pump includes first side transistors which transfer charge to said second nodes of said first pair of switched capacitors, wherein gates of said first side transistors are responsive to the first wide and first narrow clock signals; and
said negative charge pump includes second side transistors which transfer charge to said second nodes of said second pair of switched capacitors, gates of said second side transistors being responsive to the second wide and second narrow clock signals.

* * * * *